US012648110B2

(12) United States Patent
Kadhim et al.

(10) Patent No.: US 12,648,110 B2
(45) Date of Patent: Jun. 2, 2026

(54) HEAT SINK ARRANGEMENT

(71) Applicant: ICEOTOPE GROUP LIMITED, South Yorkshire (GB)

(72) Inventors: Mustafa Kadhim, South Yorkshire (GB); John Charlesworth, South Yorkshire (GB)

(73) Assignee: ICEOTOPE GROUP LIMITED, South Yorkshire (GB)

( * ) Notice: Subject to any disclaimer, the term of this patent is extended or adjusted under 35 U.S.C. 154(b) by 246 days.

(21) Appl. No.: 18/038,583

(22) PCT Filed: Nov. 30, 2021

(86) PCT No.: PCT/GB2021/053118
§ 371 (c)(1),
(2) Date: May 24, 2023

(87) PCT Pub. No.: WO2022/112799
PCT Pub. Date: Jun. 2, 2022

(65) Prior Publication Data
US 2024/0008220 A1 Jan. 4, 2024

(30) Foreign Application Priority Data
Nov. 30, 2020 (GB) ..................................... 2018819

(51) Int. Cl.
*H05K 7/20* (2006.01)
(52) U.S. Cl.
CPC ..... *H05K 7/20272* (2013.01); *H05K 7/20236* (2013.01); *H05K 7/20772* (2013.01)
(58) Field of Classification Search
CPC ........... H05K 7/20272; H05K 7/20236; H05K 7/20772; H01L 23/473
(Continued)

(56) References Cited

U.S. PATENT DOCUMENTS 9,921,622 B2 * 3/2018 Shelnutt ............. H05K 7/20818
10,390,458 B2 8/2019 Tufty
(Continued)

FOREIGN PATENT DOCUMENTS

CN 111095541 A 5/2020
CN 111989990 A 11/2020
(Continued)

OTHER PUBLICATIONS

International Search Report and Written Opinion for Application No. PCT/GB2021/053118, date of mailing Mar. 4, 2022, 16 pages.
(Continued)

*Primary Examiner* — Jayprakash N Gandhi
*Assistant Examiner* — Kyle Oxenknecht
(74) *Attorney, Agent, or Firm* — Bochner PLLC; Andrew D. Bochner

(57) ABSTRACT

A heat sink arrangement is provided for cooling first and second sets of electronic components positioned below the heat sink arrangement. This comprises: a first cooling element for cooling the first set of electronic components, wherein the first cooling element is a first heat sink comprising a base and a retaining wall that together define a volume for holding liquid coolant; and a second cooling element for cooling the second set of electronic components, configured to distribute liquid coolant over the second set of electronic components. The first and second cooling elements are arranged such that liquid coolant overflows from the volume of the first cooling element to the second cooling element for distribution over the second set of electronic components.

19 Claims, 7 Drawing Sheets

(58) Field of Classification Search
USPC .................................................... 361/679.53
See application file for complete search history.

(56) References Cited

U.S. PATENT DOCUMENTS

| | | | |
|---|---|---|---|
| 10,609,839 B1 | 3/2020 | Archer | |
| 2010/0226094 A1* | 9/2010 | Attlesey ............. | H05K 7/20772 |
| | | | 361/699 |
| 2019/0327859 A1* | 10/2019 | Iyengar .................... | H05K 3/30 |
| 2019/0380228 A1 | 12/2019 | Hirai | |
| 2020/0296862 A1 | 9/2020 | Iyengar | |
| 2022/0408609 A1* | 12/2022 | Longhurst .......... | H05K 7/20236 |

FOREIGN PATENT DOCUMENTS

| | | | |
|---|---|---|---|
| JP | 2020532875 A | 11/2020 | |
| KR | 1020200051669 A | 5/2020 | |
| WO | WO-2019048864 A1 * | 3/2019 | ......... H05K 7/20772 |

OTHER PUBLICATIONS

Notice of Reasons for Refusal of the Japan Patent Office in related Japanese Appl. No. 2023-532748, dated Mar. 25, 2025, 13 pages.
Notice of Preliminary Rejection of the Korean Patent Office in related Korean Appl. No. 10-2023-7020419, dated Jun. 10, 2025, 10 pages.
First Office Action of the China Patent Office in related Chinese Appl. No. 202180079917.3, dated Nov. 14, 2025, 14 pages.

\* cited by examiner

HEAT SINK ARRANGEMENT

FIELD OF THE DISCLOSURE

The present disclosure concerns heat sink arrangements for cooling electronic components and cooling modules comprising such heat sink arrangements.

BACKGROUND TO THE DISCLOSURE

Various types of electrical components generate heat during operation. In particular, electrical computer components such as motherboards, central processing units (CPUs) and memory modules may dissipate substantial amounts of heat when in use. Heating of the electrical components to high temperatures can cause damage, affect performance and/or cause safety hazards. Accordingly, substantial efforts have been undertaken to find efficient, high performance systems for cooling electrical components effectively and safely.

It is known to provide cooling systems that use liquid cooling. Although different liquid cooling assemblies have been demonstrated, in general the electrical components are immersed in a coolant liquid or at least come into contact with the liquid coolant so as to provide a surface area for heat exchange between the heat generating electrical components and the coolant.

It is known to cool thin, vertical components (e.g. heat sink fins) within electronic systems with front-to-rear (or rear-to-front) fan-forced air. It is also known to position the fins of heatsinks placed on top of board components such that the fins are above the tideline of any liquid coolant. Without forced air, such heat sinks have, as such, no method of dissipating their heat efficiently. In such cases, the component the heatsink is intended to cool may be sat in liquid coolant with its perimeter faces being cooled by the dielectric coolant, but not the hot central area of the chip which radiates its heat directly into the heat sink. Such systems may be inefficient and mechanical components such as fans may be prone to failure. Other examples of vertically-mounted electronic components that are not always satisfactorily cooled include dual in-line memory modules (DIMMs) and M.2s.

Thus, known liquid cooling solutions can be complex and are not always highly efficient. It is therefore an object of the present disclosure to provide improved arrangements for cooling electronic devices in more efficient and effective ways using liquid coolant.

WO-2019/048864 describes heat sinks and heat sink arrangements for an electronic device.

SUMMARY OF THE DISCLOSURE

Against this background and in accordance with a first aspect, there is provided a heat sink arrangement according to claim 1.

The present disclosure seeks generally to provide heat sink arrangements to provide more efficient cooling of electronic components. This is achieved by providing a heat sink as a first cooling element for cooling a first set of electronic devices with one or more further cooling elements configured to distribute coolant over one or more further sets of electronic devices. For instance, the heat sink may be provided on (e.g. mounted on) a central electronic component, such as a central processing unit (CPU) and the one or more further cooling elements may be positioned above adjacent sets of DIMMs to distribute coolant over the DIMMs. To this end, the one or more further cooling elements may be trays, reservoirs or any general volume having one or more openings in the base for distributing coolant over the components below. The openings can be any size and shape (e.g. slits, circular holes, triangular holes, square holes, cross-shaped holes and/or star-shaped holes) suitable for controlling the rate of flow of coolant. The desired rate of flow of coolant will depend on the temperature and dimensions of the components to be cooled.

An advantageous feature of the present disclosure is the provision of one or more further cooling elements that receive liquid coolant that overflows from the first heat sink. This form of fluid coupling eliminates or reduces the need for pipes and pumps, thereby reducing complexity and improving ease of assembly. Moreover, the coolant that overflows from the upstream heat sink would otherwise be wasted in known systems, so using this coolant in downstream secondary cooling element(s) reduces wastage of coolant. Moreover, the arrangements of the present disclosure also provide a compact, efficient arrangement for transferring coolant between multiple cooling elements. Securing cooling elements together also facilitates positioning some of the cooling elements directly above components to be cooled such that the components are cooled by coolant falling under the influence of gravity, without the need for physically attaching the cooling elements to the components. To this end, the heat sink may have a greater depth than the cooling element so that when the heat sink is mounted on a first set of electronic components (which may be a single component, such as a CPU), the cooling element is effectively suspended above a different set of components (e.g. the adjacent DIMMs or M.2s). This allows improved cooling for delicate components and/or thin components that do not permit easy attachment of traditional heat sinks.

To achieve an overflowing connection between the cooling elements through which coolant passes and the heat sink, the heat sink and cooling element may be secured together along an edge. In this way, the upper edges of the heat sink and the cooling element may be aligned and form a weir. Advantageously, the cooling element may be moveable and/or deformable so that the components below are exposed, permitting access for maintenance.

The cooling elements of the present disclosure can provide improved distribution of coolant by means of an array of openings in their bases, which are at a different height to the rest of the bases. In this way, elevated openings can be formed, surrounded by channels at a lower height. This means that when coolant enters the cooling elements, a certain level of coolant is required before coolant will pass through the base of the cooling element. Thus, substantially equal amounts of coolant can be distributed to the different electronic components at substantially the same time, providing efficient and effective cooling. Other structures for dispersing coolant can be used, such as ridges, baffles and/or protrusions. In the context of the present disclosure, any component that helps to cool other components may be considered to be a cooling element. Any arrangement of components comprising at least one heat sink may be considered to be a heat sink arrangement.

Moreover, the cooling elements of the present disclosure can be provided to advantageous effect as standalone components or as part of a cooling module. For instance, there is provided a cooling module for cooling a set of electronic components, comprising: a container configured to retain the set of electronic components within the container; and a cooling element for cooling the set of electronic components, configured to distribute liquid coolant over the set of electronic components. The cooling element may be any of the cooling elements having openings in its base described herein. For instance, the cooling element may be a perforated tray. The cooling element may alternatively be a cooling tube having openings in its underside. Such perforated trays and cooling tubes may additionally provided as standalone components, independently of the cooling module. The cooling module may comprise the set of electronic components or may simply be configured to retain the set of electronic components. The cooling elements may be configured for attachment adjacent to a further cooling element. For instance, a side of the cooling elements may comprise an attachment mechanism for securing the cooling elements (e.g. openings that screws can pass through) to an adjacent further cooling element.

In respect of any and all of the aspects disclosed herein, features of a method for manufacturing and/or operating corresponding with those of any one or more of the heat sink arrangements, cooling elements and/or cooling modules disclosed may additionally be provided. Combinations of aspects are also possible. Moreover, combinations of specific features for one aspects with the heat sinks, cooling elements and/or cooling module of another aspect are also disclosed, where such combinations are compatible. Specific examples of such combinations are suggested herein, by way of example.

BRIEF DESCRIPTION OF THE DRAWINGS

The disclosure may be put into practice in a number of ways and preferred embodiments will now be described by way of example only and with reference to the accompanying drawings, in which.

DETAILED DESCRIPTION OF PREFERRED EMBODIMENTS

Figure 1:
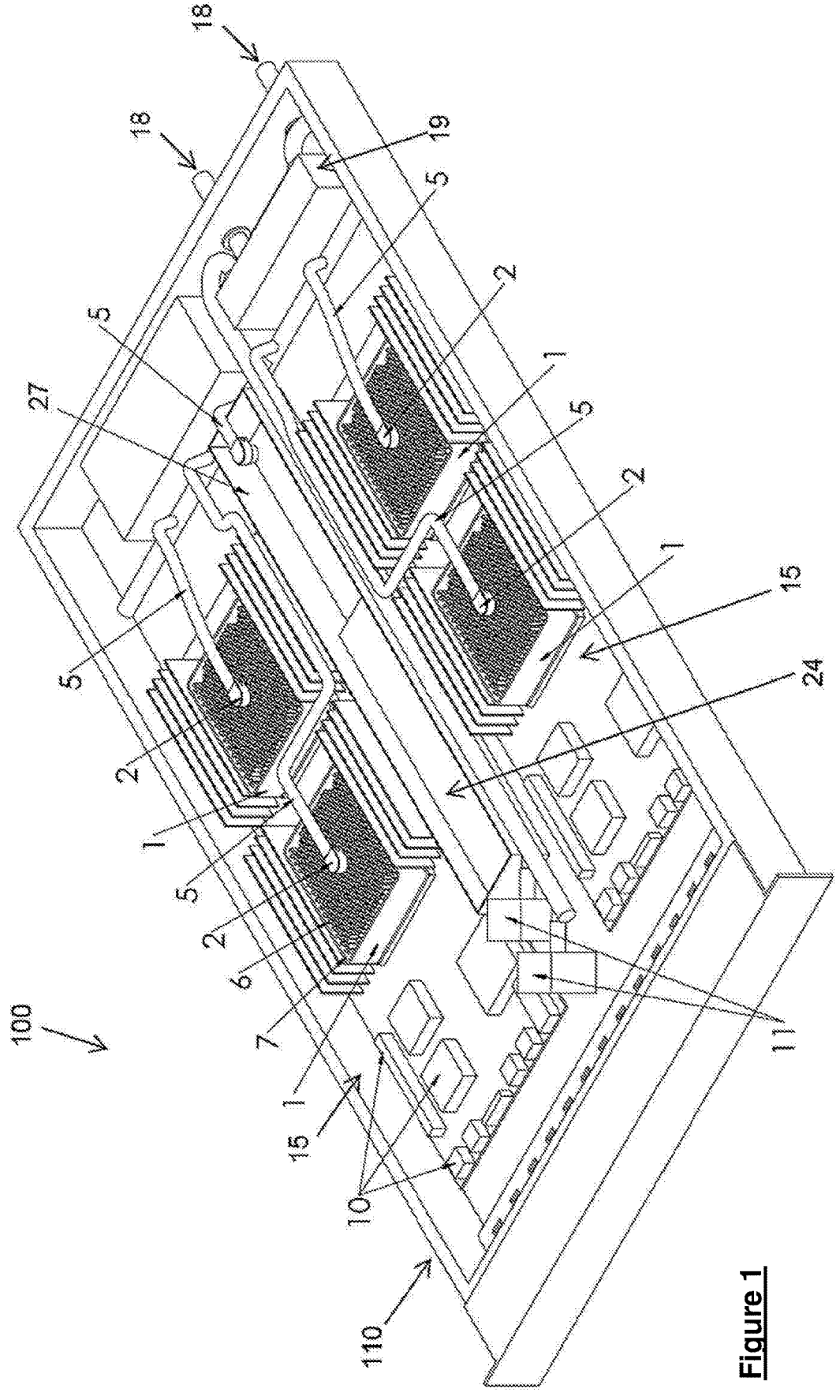
FIG. 1 shows a known cooling module in which embodiments of the present disclosure can be used.
Figure 2:
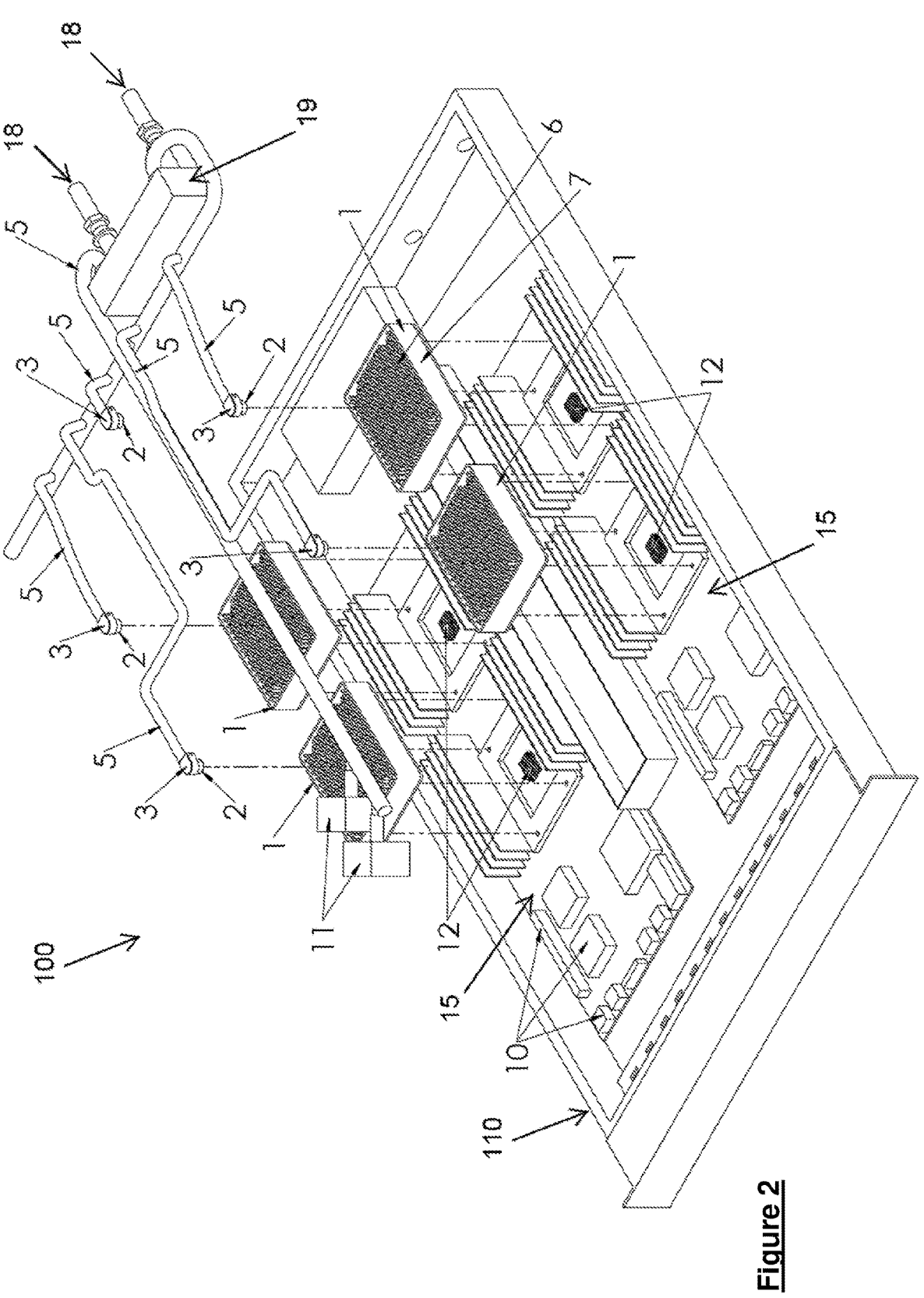
FIG. 2 depicts an exploded view of the cooling module of FIG. 1.

With reference to FIG. 1, there is shown a cooling module (sometimes termed a "chassis") in which embodiments of the present disclosure may be implemented. Also to be considered is FIG. 2, in which there is depicted an exploded view of the cooling module of FIG. 1. FIGS. 1 to 4 correspond with FIGS. 1 to 4 of WO'864, because the principles of the present disclosure can be implemented in the cooling modules described in WO'864. The cooling module 100 comprises a container 110 (shown without a lid), housing components 12 generating a relatively high temperature and components 10 generating a relatively low temperature. Both low temperature components 10 and high temperature components 12 are mounted on a circuit board 15. In FIGS. 1 and 2, two such identical circuit boards 15 are shown within the container 110. Heat sinks 1 are mounted on the high temperature components 12.

The container 110 is, in operation, filled with a dielectric liquid coolant (not shown), which may be termed a primary coolant. The liquid coolant is not electrically conductive, but is normally thermally conductive and can carry heat by conduction and/or convection. The quantity of liquid coolant inside the container 110 is sufficient to cover or immerse the low temperature components 10 at least partially, but it may not necessarily fully immerse the low temperature components 10. The level of liquid coolant used in operation is discussed below. Pumps 11 cause liquid coolant to flow through pipes 5 and travel to a heat exchanger 19. The heat exchanger 19 receives a secondary liquid coolant (typically water or water-based) and transfers heat from the liquid coolant within the container 110 to this secondary liquid coolant. The secondary liquid coolant is provided to and emerges from the heat exchanger 19 via interface connections 18. The pumps 11 cause the cooled primary liquid coolant to exit the heat exchanger 19 through pipes 5 and emerge through nozzles 2. The pipes 5 and the nozzles 2 are positioned to cause coolant to flow directly onto the heat sinks 1.

The cooling module 100 is typically a rack-mounted module and the electronic components within the container 110 are preferably at least part of a computer server circuitry, for instance comprising a motherboard and associated components. The cooling module may therefore have a height of 1 rack unit (1 U, corresponding with 44.45 mm) or an integer number of rack units. Some advantageous implementations of the present disclosure provide cooling modules having a height of 2 U (88.9 mm). It will of course be understood that the cooling module 100 may have various different sizes. For example, 1 U racks are typically provided as 19 inch racks, which have a front panel that is 19 inches (482.6 mm) wide. However, other sizes are possible, such as 21 inch (533.4 mm) or 23 inch (584.2 mm) racks. Standard sizes for racks are also defined by Open Compute Project (OCP) and the present disclosure can be used in any known, standard OCP rack. Moreover, the present disclosure can be used in any non-standard rack. It will also be appreciated that the present disclosure can be implemented in cooling modules provided as "blades" (i.e. vertical rather than horizontal enclosures); the shape of the container does not significantly impact the functionality of the cooling elements described herein.

The cooling module 100 may be configured for installation or installed in a corresponding rack, housing multiple such cooling modules (one, some or all of which may have different internal construction from cooling module 100 disclosed herein). In this configuration, the secondary liquid coolant may be shared between cooling modules in a series or parallel arrangement. A plenum chamber and/or manifold may be provided in the rack to allow this. Other components may be provided in the rack for efficient and safe (such as power regulators, one or more pumps or similar devices).

Figure 3:
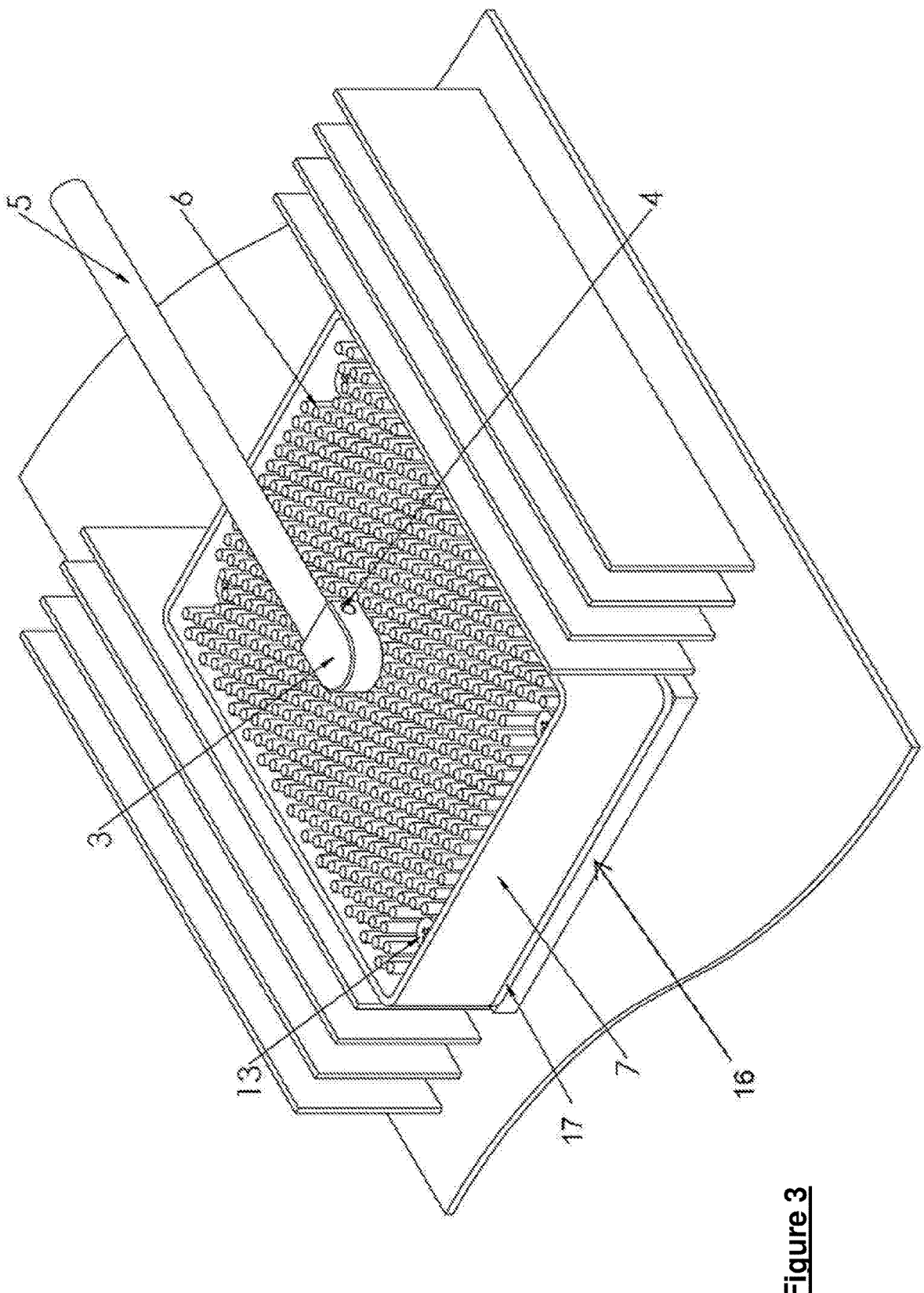
FIG. 3 illustrates an example of a known heat sink for use with embodiments of the present disclosure.
Figure 4:
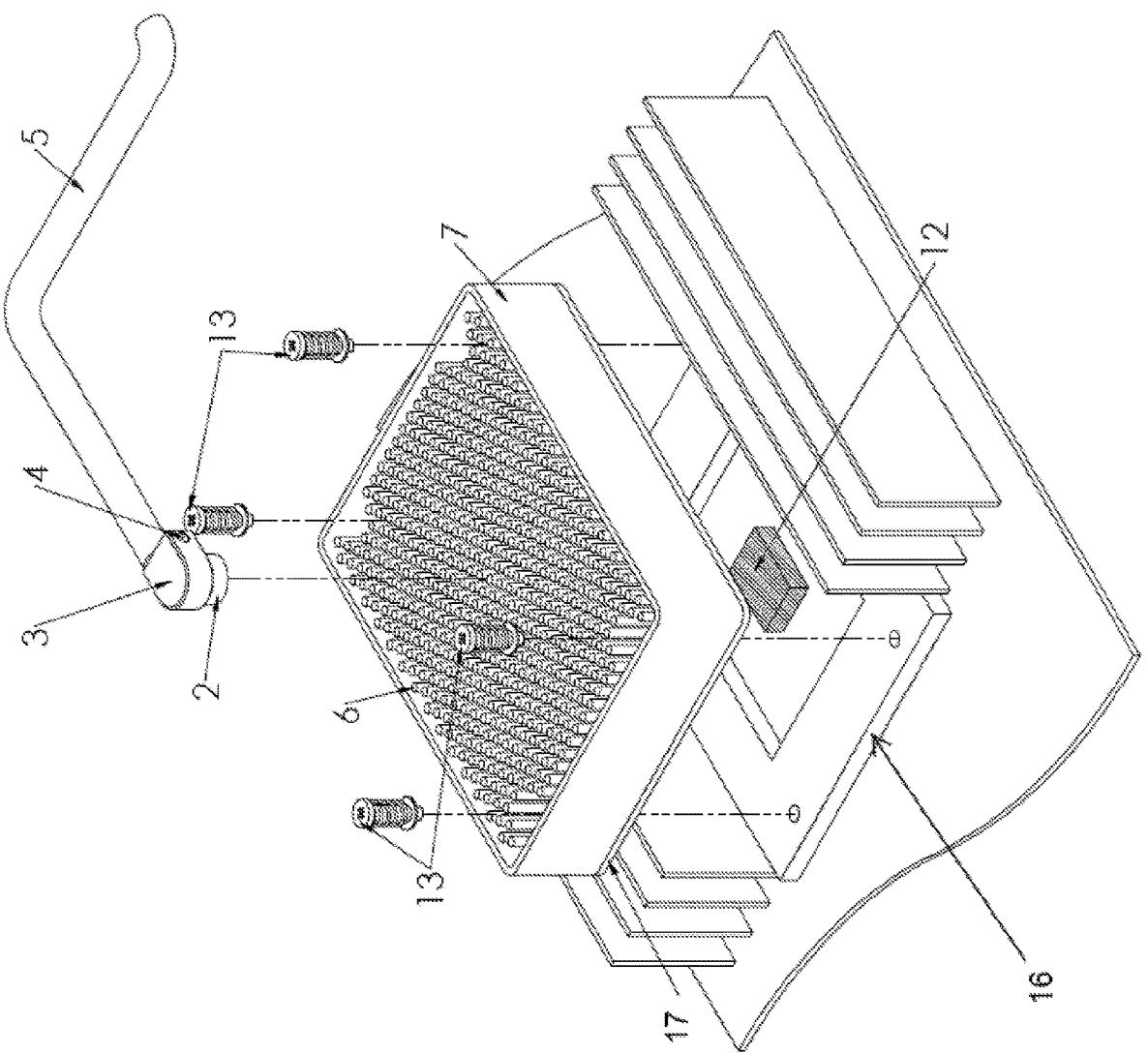
FIG. 4 depicts an exploded view of the heat sink of FIG. 3.

Referring to FIG. 3, there is illustrated a known heat sink, which can be used in embodiments of the disclosure. With reference to FIG. 4, there is shown an exploded view of the heat sink of FIG. 3. This is a magnified view of the heat sink shown in FIGS. 1 and 2. The heat sink 1 comprises: a base made up of a mount 16 and a planar substrate 17 fixed to the mount 16; a retaining wall 7 attached to the planar substrate 17; projections (shown in the form of pins) 6; and fixing screws 13, which attach the substrate 17 to the mount 16. In this way, the planar substrate 17 sits directly on the high temperature component 12 and transfers heat from the high temperature component 12 to a volume defined by the planar substrate 17 and the retaining wall 7, in which projections 6 are provided. Thus, in general terms, there is provided a volume for holding or retaining liquid coolant against a heat-generating electronic device, for example resembling a bath or reservoir. Coolant may then be pumped from a low-level within the cooling module to within the volume of the heat sink, at a higher level. A number of different structures and embodiments of such a heat sink and/or cooling module in accordance with this design are discussed herein and in WO'864, the entirety of which is incorporated herein by reference.

The heat sink 1 can be made from a single component, for example by: die cast; lost wax casting; metal injection mould (MIM); additive manufacture; or forged. It could also be machined out of a block of material or skived. The heat sink 1 may be formed from any material that is thermally conductive, such a metal or other thermal conductor. Some examples may include aluminium, copper or carbon. The heat sink 1 may comprise two (or three or more) different materials. Additionally or alternatively, the heat sink may comprise a mixture of materials (e.g. a mixture of copper and aluminium).

Also shown in FIGS. 3 and 4 are pipe 5 and nozzle 2. The liquid coolant is delivered to the heat sink 1 via the nozzle 2. The nozzle 2 is arranged to direct coolant perpendicular to the plane of the substrate 17. This forces the jet or flow of the liquid coolant directly into the volume defined by the substrate 17 and retaining wall 7 of the heat sink 1. As a consequence, the heat dissipation is improved. This is especially the case in comparison with a system where the coolant is directed to flow over the heat sink, in a direction parallel to the plane of the heat sink substrate, such as in an air cooled system.

In the examples shown in FIGS. 3 and 4, the nozzle 2 delivers the coolant directly in the centre of the volume defined by substrate 17 and retaining wall 7. In this example, the centre of that volume corresponds with the hottest part of the area of the substrate 17, which is adjacent to (and directly on) the high temperature component 12. This provides a contraflow, such that the coldest coolant is directed to contact the hottest area of the heat sink. The coolant moves out radially from the hottest part.

The nozzle 2 is designed to have a push-fit connection 3 to the pipe 5. This does not require tools, so it can be fitted and removed straightforwardly. Consequently, replacing circuit boards 15, which may be computer motherboards, all the components can be easy and quick. The nozzle is further provided with an earth point 4, which can be coupled to an earth or ground point, to eliminate static build up in the pipe 5 and nozzle 2.

In generalised terms, the heat sink 1 in FIGS. 1 to 4 provides a first cooling element for cooling the first set of electronic components. The first cooling element is a first heat sink comprising a base and a retaining wall that together define a volume for holding liquid coolant. The first cooling element may be configured for mounting on top of a heat-transmitting region (e.g. a surface of a CPU or baseboard management controller, BMC) of the first set of electronic components (which may be a single component or a plurality of components), and it is preferred that the base of the first cooling element is configured for mounting on top of a heat-transmitting region of the first set of electronic components. This allows efficient cooling of the first set of electronic components.

The cooling module, container and heat sink arrangements shown in FIGS. 1 to 4 and described above are known from, for example, WO'864, the entirety of which is incorporated herein by reference. Embodiments of the present disclosure seek to provide modifications and enhancements to the devices and systems disclosed in WO'864. To that end, the heat sink arrangements of embodiments of the present disclosure can be implemented in any of the arrangements disclosed in WO'864.

Figure 5:
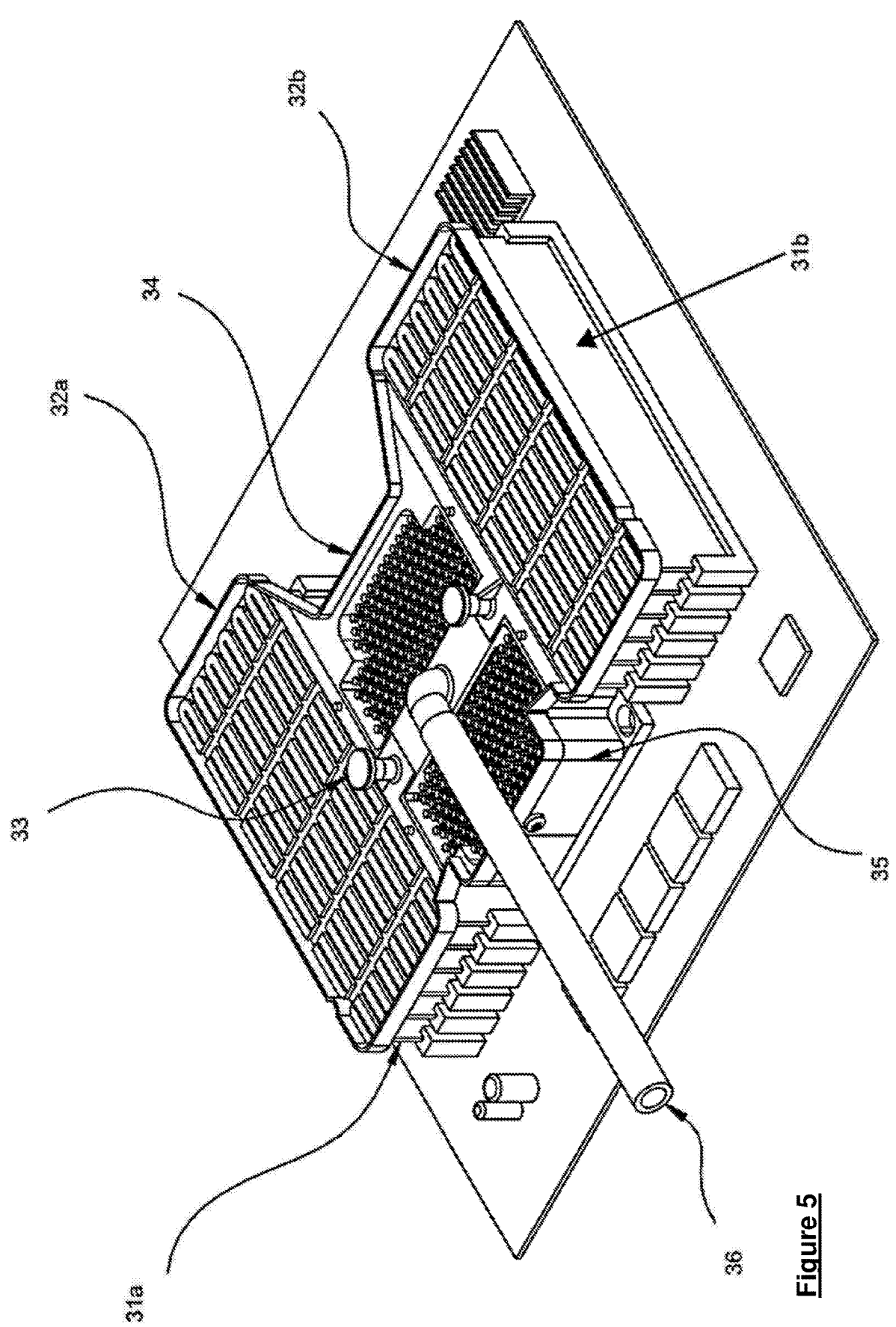
FIG. 5 depicts a perspective view of a heat sink arrangement according to a first embodiment.
Figure 6:
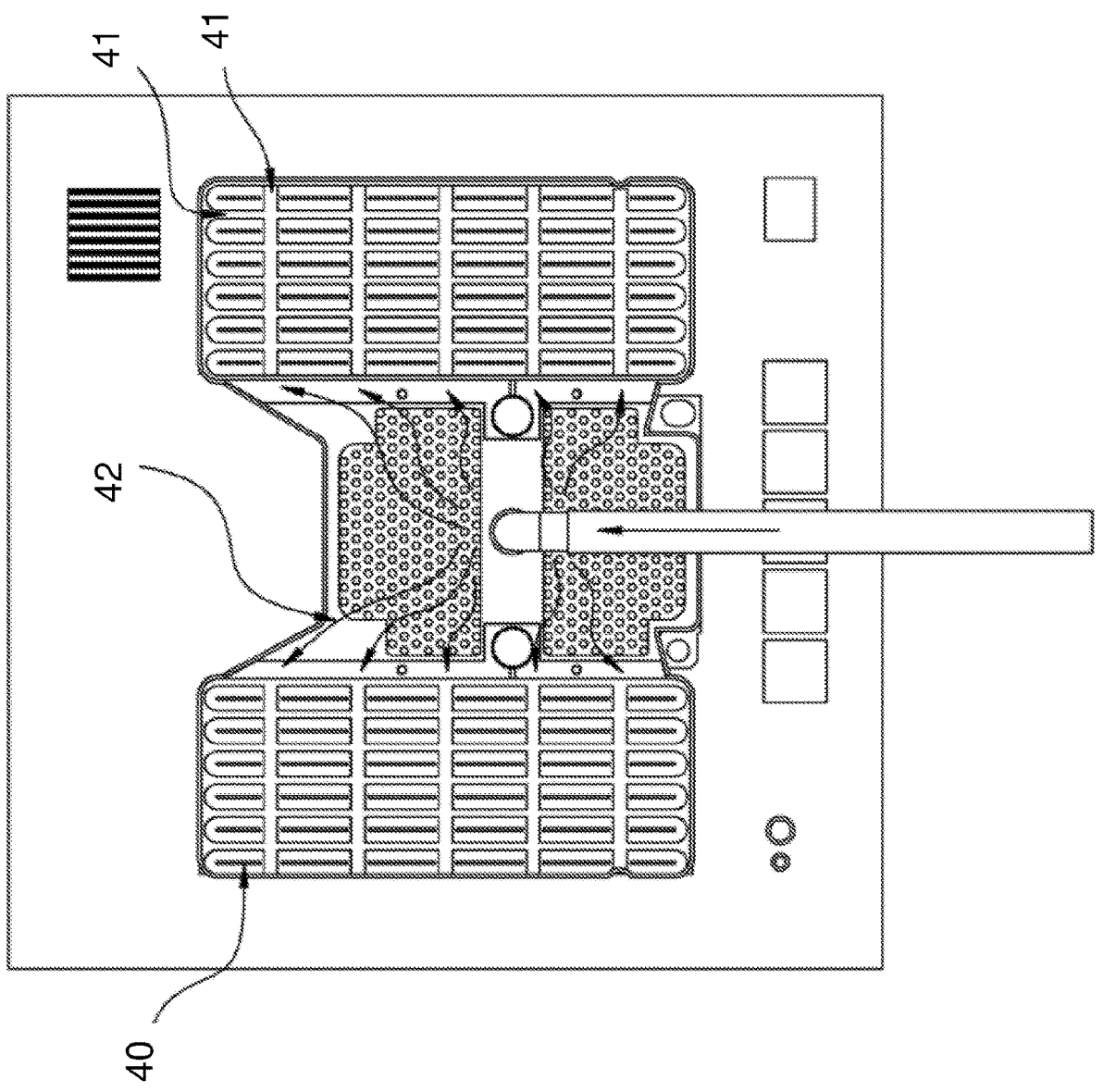
FIG. 6 depicts a plan view of the heat sink arrangement of the first embodiment.
Figure 7:
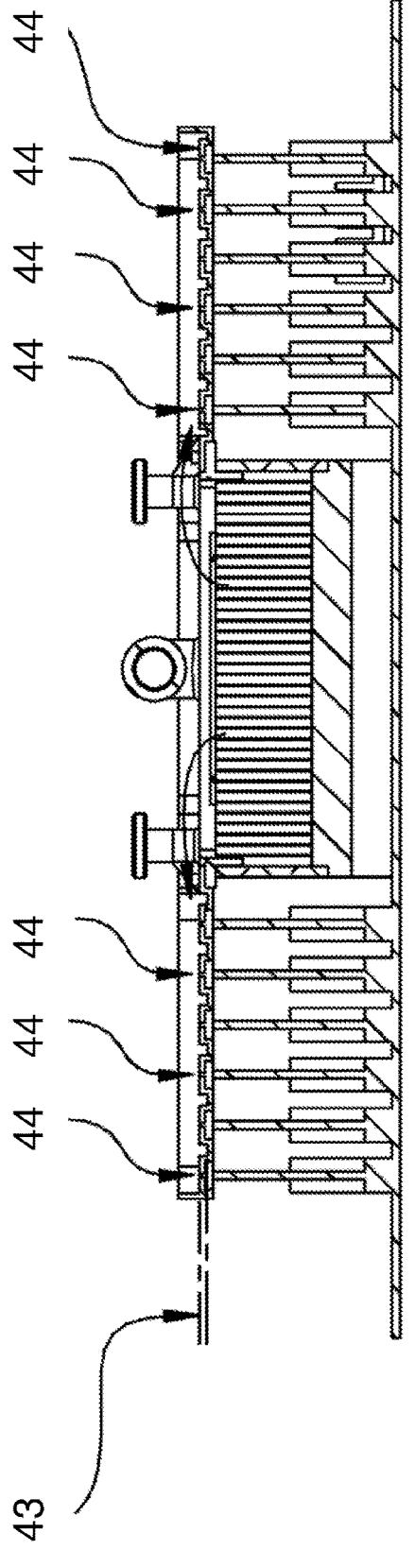
FIG. 7 depicts a side view of the heat sink arrangement of the first embodiment.

Turning to FIGS. 5 to 7, there are shown a heat sink arrangement in a first embodiment. FIGS. 5 to 7 relate to the different views of the same heat sink arrangement. The heat sink arrangement comprises a first cooling element 35, which is a heat sink that is substantially similar to the heat sinks 1 of FIGS. 1 to 4. The first cooling element 35 is fed by a tube 36, which is similar to the pipe 5 of FIGS. 1 to 4. The first cooling element 35 is configured for attachment to a first set of electronic components (which may be one component, such as a CPU or BMC, or a plurality of electronic components), similarly to the way in which the heat sinks 1 of FIGS. 1 to 4 are configured to be mounted on electronic components 12.

In FIGS. 1 to 4, each heat sink 1 is provided on top of a respective electronic component 12. The first cooling element 35 of FIG. 5 may be provided to cool a single electronic component (like electronic component 12 in FIGS. 1 to 4) or a plurality of electronic components.

In FIGS. 1 to 4, disposed symmetrically on either side of the electronic components 12 are sets of thin, vertically-mounted components 31a and 31b, which are substantially parallel. In FIGS. 1 to 4, each heat sink 1 has two sets of three vertically-mounted components on opposite sides of the heat sink 1 (i.e. six vertically-mounted components in total). In the embodiment of FIGS. 1 to 4, these are cooled primarily by heat exchange from their surfaces with the surrounding atmosphere and by coolant circulating within the base of the container 110. Similar vertically-mounted components 31a and 31b are depicted in FIG. 5 and these are cooled partially by the same or similar means described in relation to FIGS. 1 to 4. However, in FIG. 5, two sets of six vertically-mounted electronic components 31 are shown. Moreover, the vertically-mounted components 31 are cooled by additional means, as will be discussed in further detail below. The two sets of six vertically-mounted electronic components may be considered to be second set of electronic components 31a and a third set of electronic components 31b, corresponding to the second 32a and third 32b cooling elements, respectively.

The first embodiment of the present disclosure provides second and third cooling elements 32a and 32b adjacent the first cooling element 35, which in FIG. 5 are shown as trays (receptacles for liquid that have substantially flat bases and upstanding retaining walls, with no lid or top surface provided) having openings or apertures in their bases for allowing liquid coolant to pass through the bases of the second and third cooling elements 32a and 32b. The second and third cooling elements 32a and 32b are disposed and secured on either side of the first cooling element 35.

In generalised terms, therefore, the second cooling element may extend along an edge of the first cooling element. The second cooling element may also be described as being secured adjacent to the first heat sink and/or secured laterally to the first heat sink. The first and second heat sinks may be considered to share a border or edge. Moreover, the bases of the first and second heat sinks are substantially parallel, in normal use. The first and second cooling elements are preferably secured (i.e. directly, meaning in physical contact, or indirectly, for example by physically coupled through intermediate components) to each other. The second cooling element may be secured (directly or indirectly) to an upper edge of the retaining wall of the first cooling element. In this way, the border between the first cooling element and the second cooling element may act as a weir, as will be described in greater detail below. The geometric relationship between the first cooling element and the second cooling element may be substantially identical to the geometric relationship between the first cooling element and the third cooling element, due to the similarities between the second and third cooling elements.

The second and third cooling elements 32a and 32b may be described informally as "dribble-trays", due to the way in which coolant passes slowly, or dribbles, through the openings. The second and third cooling elements 32a and 32b are suitable for providing 'liquid-film cooling' for the vertically-mounted sets of board components 31a and 31b, which are directly below the second and third cooling elements 32a and 32b. Thus, the second and/or third sets of electronic components 31a and/or 31b each comprise one or more electronic components positioned below the second and/or third heat sink, respectively. It will be appreciated that "below" in the context of the present disclosure may be taken to mean "below" when the system is in normal use. During normal use, gravity exerts a force on the liquid coolant. This force is generally from above and points along the direction of the retaining walls and towards the bases of the first 35, second 32a and third 32b cooling elements.

In the context of the present disclosure, liquid-film cooling may be considered to be a method of cooling electronic components in which a thin film of liquid coolant is allowed to fall onto the electronic components at a rate and in an amount that ensures that the surface of the components is covered by a thin layer of coolant. This approach uses the surface tension of coolant to ensure that the coolant essentially sticks to the components (e.g. DIMMs) as it flows down the surfaces of these components. This contrasts with allowing coolant to drip slowly onto components below, which leads to the components only being cooled intermittently as drips land on the surface. Liquid-film cooling also contrasts with immersing or pouring a large amount of coolant on to the components, which can be relatively wasteful. This also differs from spraying coolant at vertically-mounted electronic components from the side, which is difficult when arrays of closely-packed components need to be cooled. Hence, liquid-film cooling is more efficient and effective than some known cooling techniques.

The second and third cooling elements 32a and 32b are configured to cool various types of thin, vertically-mounted sets of components 31a and 31b, such as dual in-line memory module (DIMM) boards, or the fins of traditional aluminium heat sinks placed upon components such as the BMC chip on any server motherboard that is cooled by the liquid-film cooling of the present disclosure. Cooling is achieved by allowing dielectric liquid coolant to pass (e.g. to dribble) through the base of the second and third cooling elements 32a and 32b via openings 40 in their bases, such that the components 31a and 31b below are contacted by coolant and therefore cooled.

Turning next to FIG. 6, a plan view of the heat sink arrangement of FIG. 5 is provided. In FIG. 6, the openings 40 in the base of the second and third cooling elements 32a and 32b can be seen more clearly. From viewing FIG. 6, it will be apparent that the second and third cooling elements 32a and 32b are designed to feed coolant onto the second and third sets of components 31a and 31b below at a set (e.g. predefined) rate. It is most preferred that the openings 40 in the base of the second and third cooling elements 32a and 32b are provided as elongate slits. Such slits act as perforations in the second and third cooling elements 32a and 32b, so that the second and third cooling elements 32a and 32b can be described in alternative terms as trays for containing liquid coolant with perforations for allowing the coolant to dribble through the base of the trays (or "perforated dribble-trays", in short). When the openings 40 are provided as slits, a set rate of coolant flow is achieved by controlling the specific size (length and width) and the quantity of such slit openings 40. In FIG. 6, the openings 40 in each of the second and third cooling elements 32a and 32b are provided in a regular, 6×6 array, which corresponds to the arrangement of the 6×1 sets of electronic components 31a and 31b mounted below the second and third cooling elements 32a and 32b. In FIG. 6, it can be seen that 6 elongate slits in the bases of the second and third cooling elements 32a and 32b are aligned along the length of a single DIMM, to provide effective cooling thereof.

Hence, returning to the generalised terms used previously, a base of the second cooling element may comprise one or more openings, which preferably comprise elongate slits (but which may be of various other shapes, such as circular holes, triangular holes, square holes, cross-shaped holes and/or star-shaped holes), for distributing liquid coolant over a respective one or more electronic components of the second set of electronic components. Accordingly, coolant can be distributed to components positioned below such a cooling element, even when it is difficult to attach conventional heat sinks to those components.

Slits are preferred because they allow a high degree of control over the flow rate through control of the geometry of the slits. The openings or slits may advantageously dimensioned to correspond with the second set of electronic components. When a third cooling element is provided, it may have substantially the same form and openings as the second cooling element.

The embodiment of FIGS. 5 to 7 shows a preferred arrangement, by way of example only. In this embodiment, two sets of 6 DIMMs 31a and 31b are depicted each side of the CPU 35, giving 12 DIMMs in total. The DIMMs are cooled through elongate slits 40. Each DIMM uses 8 W of power and the total DIMM power is therefore 96 W. In order to achieve an optimal degree of cooling for this particular arrangement, a total flow rate (i.e. the coolant distributed on both sides of the CPU 35) of liquid coolant for the 12 DIMMs is preferably 1.9 L/min. To achieve this, a slit width of 0.75 mm is used, although from 0.5 mm to 1 mm could be used to provide efficient cooling. If a width of less than 0.5 mm is used, then in this case with the particular coolant used, the coolant would drip rather than pour continuously (at the typical temperatures reached with standard coolants at these power ratings and the flowrate of coolant in the system shown in this embodiment). Future generation DIMMs are projected to use 24 W of power each, so the flow rate (and hence the dimensions of the slits) would be increased to compensate for the higher temperatures in such systems. Therefore, it will be understood that the specific size and shape of the openings can be varied depending on the components to be cooled and the skilled person will be able to adjust the size and shape of the openings to achieve a desired flow rate. Therefore, the invention is not limited to the shapes and dimensions shown and described herein.

Referring now to FIG. 7, there is shown a side view of the heat sink arrangement of FIGS. 5 and 6. In FIG. 7, it can be seen that the second and third cooling elements 32a and 32b are further designed to permit dielectric liquid coolant to fill the cooling elements 32a and 32b to a set level, which is denoted by the filling level 43. In use, as liquid coolant enters the second and third cooling elements 32a and 32b, they gradually fill to the filling level 43. Once this level is surpassed, coolant can flow through the openings 40 on to the sets of vertically-oriented components 31a and 31b underneath. Advantageously, this ensures that all components covered by the second and third cooling elements 32a and 32b receive substantially equal amounts of coolant and that distribution of coolant commences through each opening 40 at substantially the same time (i.e. when the second and third cooling elements 32a and 32b are filled to the filling level 43 with coolant). This is achieved by elevating the surface of the openings 40, such that the base comprises elevated portions 44 within which the openings 40 are formed. This creates a crosshatch of longitudinal and latitudinal channels 41 (and these channels 41 may be considered to comprise a plurality of channel portions that may or may not extend to the edge of the second and third cooling elements 32a and 32b), which are best seen in FIG. 6. These channels 41 allow for the dielectric to disperse efficiently and effectively across the base of the second and third cooling elements 32a and 32b.

In generalised terms, it is preferred that the one or more openings are elevated with respect to (i.e. raised above, relative to the direction of gravity during normal use) the base of the second cooling element, preferably wherein the one or more openings are at substantially the same height above the base of the second cooling element. It is also preferred that the base of the second cooling element comprises a structure for dispersing liquid coolant across the base of the second cooling element. The structure may be any structure suitable for guiding coolant in a way to ensure the coolant is distributed evenly. For instance, the structure may comprise any combination of: one or more channels (or channel portions); one or more ridges; one or more baffles; and/or one or more protrusions (e.g. upstanding portions). The structure may surround the one or more openings and/or the structure may comprise a plurality of longitudinal and latitudinal (e.g. perpendicular or non-parallel channels portions, which may be parallel with the walls of the cooling element, or which may be at any angle to the walls of the cooling element) channel portions (which may be joined together to form a single channel or which may be distinct channel portions or depressions in the base) that extend (either partially or the entire way) across the base of the second cooling element (e.g. forming a crosshatch around an array of openings). In this way, the flow of coolant through the second cooling element can be controlled such that each opening distributes substantially the same amount of coolant over the second set of electronic components at substantially the same time, ensuring a uniform and effective degree of cooling is achieved. It will be appreciated again that when a third cooling element is provided, it may have substantially the same form and openings as the second cooling element and so the above description of the second cooling element applies equally with respect to the third cooling element.

It will be noted that in FIG. 7, the depth (i.e. the spatial extent of the elements in the direction of gravity when the system is oriented for normal use) of the second and third cooling elements 32a and 32b is substantially less than the depth of the first cooling element 35. In practice, the difference between their depths is preferably on the order of the installed height of a DIMM or a M.2. When the first heat sink 35 is mounted on an electronic component (e.g. the component 12 in FIGS. 1 to 4), this allows the second and third cooling elements 32a and 32b to be suspended above components to be cooled, which in this case are the vertically-mounted components 31a and 31b, such that the second and third cooling elements 32a and 32b distribute coolant over the vertically-mounted components 31a and 31b. Hence, in general terms, it is advantageous that a depth of the first cooling element is greater than a depth of the second (and third, if present) cooling element. This ensures that there is space below the second coupling element for components to be cooled to receive sufficient coolant, thereby improving performance.

The second and third cooling elements 32a and 32b are configured to permit servicing of the second and third sets of components 31a and 31b below. For instance, the second and third cooling elements 32a and 32b are designed to be easily movable and/or removable to allow service access to the second and third sets of electronic components 31a and 31b (which are sets of DIMM boards in this embodiment), or other vertical components such as M.2, sat underneath. In this instance, the second and third cooling elements 32a and 32b are attached to a brace support frame 34, as shown in FIG. 5.

In FIG. 5, the brace support frame 34 is secured within the first cooling element 35 (which in this case is an Iceotope® CPU bath heat sink (which is a heat sink having a volume for holding or retaining liquid coolant against a heat-generating electronic component, for example resembling a bath or reservoir) by means of a captive thumb screw 33. It will be appreciated that the method of access to the sets of components 31a and 31b below the second and third cooling elements 32a and 32b might alternatively incorporate a hinge/pin or living-hinge mechanism off a similar brace structure. This would allow the second and third cooling elements 32a and 32b to be temporarily hinged clear of the sets of components 31a and 31b such that they can be accessed and serviced and/or replaced.

In FIGS. 5 to 7, the cooling element 35 is a bath heat sink. The brace support frame 34 is a component (preferably made from plastic, although various other materials can be used) that sits on the upper edge of the bath heat sink 35, whilst the cooling elements 32a and 32b are components (again, preferably made from plastic, but other materials can be used) that attach to the brace support frame 34. Therefore, the brace support frame 34 provides an attachment mechanism for allowing the cooling elements 32a and 32b to be coupled (e.g. retrofitted) to the bath heat sink 35.

It will be appreciated that the cooling elements 32a and 32b can also be formed integrally with the bath heat sink. For example, the bath heat sink 35 and the cooling elements 32a and 32b could share a single wall. Within this shared wall, an opening (or multiple openings) could be provided to allow coolant to flow from the bath heat sink into the cooling elements. Whilst in such a case, coolant would not flow over the uppermost edge of the retaining wall of the first cooling element, it will be understood that the coolant must reach a certain depth in the bath heat sink before it can flow through the opening (or openings) in the shared wall and into the adjacent cooling elements. The depth that the coolant must reach is essentially the height of the lowermost portion (i.e. the bottom edge) of the opening (or openings) in the shared wall. Hence, coolant flowing through an opening in a shared wall must necessarily flow over the bottom edge of the opening (or openings) and coolant flowing in this way would therefore be considered to be liquid coolant that overflows from a volume of a first cooling element to a second cooling element for distribution over a second set of electronic components, in the generalised language used throughout the present disclosure. Accordingly, in the general terms used previously, in the heat sink arrangements of the present disclosure, the first and second cooling elements may share a wall comprising at least one opening for allowing water to overflow through the at least one opening from the first cooling element into the second cooling element.

Hence, in generalised terms, in the present disclosure the second cooling element is preferably releasably (e.g. such that the second cooling element can be removed entirely) and/or pivotably (e.g. such that the second cooling element can be rotated to expose the second set of electronic components) secured to permit access to the second set of electronic components. Thus, easy servicing and/or replacement of components may be provided. Examples of suitable releasable and/or pivotable securing mechanisms include captive screws, hinges and living hinges. Other examples will be apparent to the skilled reader. Such an approach is advantageous because the second set of electronic components set may comprise an array (e.g. a 3×3 array) of components below the second cooling element. The components of the second set that are at the perimeter of a 3×3 array might be accessible even when the second heat sink is secured in place. However, the central component of such a 3×3 array may be covered by the second cooling element and therefore difficult to replace and/or service. By configuring the second heat sink such that it can be moved out of the way, serviceability is improved. When a third cooling element is provided, it may have be secured in the same way as the second cooling element.

Additionally or alternatively, the second and/or third cooling elements 32a and 32b may be formed from a flexible material, such as an elastically deformable material, that is compliant and can be temporarily bent out of the way to permit access to the second and third sets components 31a and 31b. Numerous materials suitable for this purpose will be apparent to the skilled reader, including various flexible polymer (e.g. rubberised) type materials. In generalised terms, therefore, the second and/or third cooling element may be movable and/or elastically deformable to permit access to the second and/or third set of electronic components. Again, this provides easy access to service to facilitate servicing and/or replacement of parts. Stated differently, the second and/or third cooling element may be movable and/or elastically deformable from a first configuration, in which a base of the second and/or third cooling element is substantially parallel to the base of the first cooling element, to a second configuration, in which the second and/or third set of electronic components is accessible (i.e. exposed for maintenance). The degree of deformation or rotation required to permit access to the second and/or third set of electronic components will depend on the geometry of the components on the motherboard, but in general terms it is advantageous for the second and/or third cooling element to be deformable, pivotable or moveable such that its base (or at least a portion of the base) is oriented at an angle to the horizontal (when in normal use) of: at least 15°; at least 30°; at least 45°; at least 60°; at least 75°; or greater than 90°.

It is common to change the population of DIMM slots over time. For example, it is common for a board to be capable of accommodating a larger number of DIMMs than are actually installed, as typically only high-end boards utilise all available DIMM slots without leaving any slots unoccupied. For instance, in many systems, only 3 of the 6 on each DIMM slots on side of the CPU will be occupied. Nevertheless, it is common for such systems to be upgraded over time (e.g. by adding further DIMMs) and the present disclosure makes such upgrades relatively straightforward. A further advantage of the present disclosure is that the same cooling element can be used for various different numbers of DIMMs (or other electronic components). The cooling elements of the present disclosure may have a certain number of openings and this may be greater than the number of electronic components below. However, this is no more wasteful than existing bath heat sinks, because the combination of first and second cooling elements recycles coolant that would otherwise be wasted in known systems. In other words, the coolant overflowing from the first cooling element would typically not be used for further cooling of other electronic components in known systems, so even when the number of openings in the cooling elements exceeds the number of electronic components below, no more coolant is wasted than would be the case if the first cooling element was used in isolation. Hence, allowing coolant to pass through openings in the cooling element that are not above an electronic component does not waste any more coolant than is wasted by known systems in which the coolant overflows and runs down the side of the heat sink to the base of the cooling module.

The second and third cooling elements 32a and 32b described above provide an efficient means for cooling the second and third sets of electronic components 31a and 31b provided below. They accommodate various component layouts, as the second and third cooling elements 32a and 32b can be sized to accommodate any number of and/or any layout of the sets of vertical components 31a and 31b on the server motherboard. DIMMs are conventionally laid out equally either side of the CPU, as shown in FIGS. 1 to 7. Hence, in this embodiment, the attachment method of these examples is a central brace frame 34 mounted within the first cooling element 35, which is a bath heat sink that is suitable for attachment to such a brace frame 34. The brace support frame 34 sits at the top of the retaining wall of the first cooling element 35 to permit the second and third cooling elements 32a and 32b to be attached adjacent to the first cooling element 35.

Hence, returning to the generalised terms used previously, the second cooling element may be secured to a support frame that spans and/or at least partially surrounds the volume of the first cooling element. The support frame may be configured to sit on top of and/or be attached to a retaining wall of the first cooling element. The support frame may alternatively be described as bridging from the retaining wall on one side of the first heat sink to the retaining wall on an opposite side of the first heat sink. The support frame may provide the dual functions of permitting attachment of the second cooling element (and preferably in such a way as to permit access to the components below) whilst also enhancing the structural integrity of the first heat sink. If present, the third cooling element may be attached in the same way as the second cooling element.

As noted previously, the second and third cooling elements 32a and 32b can be used advantageously in combination with an Iceotope® CPU bath heat sink 35. In this context, dielectric coolant can be fed directly from the heat sink 35 to the second and third cooling elements 32a and 32b. In the first embodiment shown in FIGS. 5 to 7, coolant enters the first cooling element 35 via the tube 36. The single tube 36 feeds the first cooling element 35, which in turn feeds the second and third cooling elements 32a and 32b, for cooling the sets of vertically-mounted electronic components 31a and 31b (which are DIMMs in this embodiment). Nevertheless, it will be appreciated that the second and third cooling elements 32a and 32b can be provided as standalone components and can be employed without a heat sink of the type of the first cooling element 35. In such cases, the second or third cooling element 32*a* or 32*b* could be fed by a tube system and/or a channel/duct.

In use, coolant accumulates within the first cooling element 35 until the level of coolant reaches the top of the retaining wall of the first cooling element 35. At this point, coolant overflows from the first cooling element 35 into the second and third cooling elements 32*a* and 32*b*, as represented by the directional arrows 42 in FIG. 6, which show the path of liquid coolant flowing over the retaining wall of the first cooling element 35. Hence, the border between the first cooling element 35 and the second and third cooling elements 32*a* and 32*b* acts as a weir over which coolant flows. Advantageously, this embodiment combines multiple cooling elements 35, 32*a* and 32*b* into a single arrangement, reducing complexity by reducing or eliminating the need for tubes and connections between disparate cooling elements. Thus, efficient cooling is provided whilst also providing mechanical robustness due to the coupling used. This form of fluid coupling between the first cooling element 35 and the second and third cooling elements 32*a* and 32*b*, whereby coolant overflows from the first cooling element 35, can be implemented in conjunction with any of the mechanisms for permitting access to the second and third sets of electronic components 31*a* and 31*b* (e.g. living-hinge, captive thumb screw, hinge/pin and/or the use of a flexible material) described previously.

Thus, in generalised terms, the embodiment of FIGS. 5 to 7 provides a heat sink arrangement for cooling first (e.g. a CPU) and second (e.g. one of the sets of DIMMs adjacent the CPU) sets of electronic components (noting that a set may comprise one or a plurality) positioned below (i.e. downwards when the arrangement is in use) the heat sink arrangement. The heat sink arrangement comprises: a first cooling element (e.g. the heat sink 1 of FIGS. 1 to 4) for cooling the first set of electronic components, wherein the first cooling element is a first heat sink comprising a base and a retaining wall that together define a volume for holding liquid coolant. The heat sink arrangement also comprises a second cooling element (e.g. one of the perforated trays 32*a* and 32*b* through which coolant flows) for cooling the second set of electronic components, configured to distribute liquid coolant over (e.g. by allowing coolant to flow through its base under the influence of gravity) the second set of electronic components. The first and second cooling elements are arranged such that liquid coolant overflows from the volume of the first cooling element to the second cooling element for distribution over the second set of electronic components. It will be understood that the first and second sets of electronic components are distinct. Similarly, the first and second cooling elements are distinct.

It will be understood that while embodiments of the disclosure are described with reference to the second and third cooling elements 32*a* and 32*b* being adjacent a bath heat sink 35, such as the heat sink 1 of FIGS. 1 to 4, other types of heat sink can be used. For instance, one or more of the second and third cooling elements 32*a* and 32*b* can be arranged to receive overflowing coolant from the heat sink 20 or 20' of FIGS. 17 and 18 of WO'864. For instance, one or more of the second and third cooling elements 32*a* and 32*b* of the present disclosure could be provided near the spout 25 of the heat sinks 20 or 20'. Moreover, the same is true in respect of the retaining wall 46 in the embodiments shown in FIGS. 22A to 22D and the retaining wall 46*a* shown in FIGS. 23A to 23I of WO'864. These retaining walls 46 and 46*a* could be arranged to overflow into one or more of the second and third cooling elements 32*a* and 32*b* of the present disclosure. All other aspects of WO'864 can be provided with one or more of the second and third cooling elements 32*a* and 32*b* of the present disclosure, so are not described further herein for brevity. Nevertheless, it will be appreciated that the present disclosure provides a number of enhancements to known heat sink arrangements.

Whilst first, second and third cooling elements have been described in relation to FIGS. 5 to 7, it will be appreciated that different numbers of such components can be provided. For instance, a heat sink arrangement may comprise one heat sink and one other cooling element such as the second or third cooling element 32*a* or 32*b*. Alternatively, the second or third cooling elements 32*a* or 32*b* could be provided as standalone components. Moreover, a plurality of heat sinks like the heat sink 1 for cooling the electronic components 12 can be provided with just one cooling element (e.g. one of the second and third cooling elements 32*a* and 32*b*). Hence, returning to the generalised terms previously, there may additionally be provided a third cooling element for cooling a third set of electronic components, configured to distribute liquid coolant over the third set of electronic components. In such a case, the second and third cooling elements may be disposed on opposite sides of the first cooling element. The second and third cooling elements are substantially symmetric about a plane passing through the first cooling element. In other words, the second and third cooling elements may be mirror images of them, owing to the typically symmetric arrangement of components (e.g. CPUs and DIMM or M.2) on a motherboard. Of course, it will also be understood that non-symmetric arrangements of cooling elements can be provided.

Figure 8:
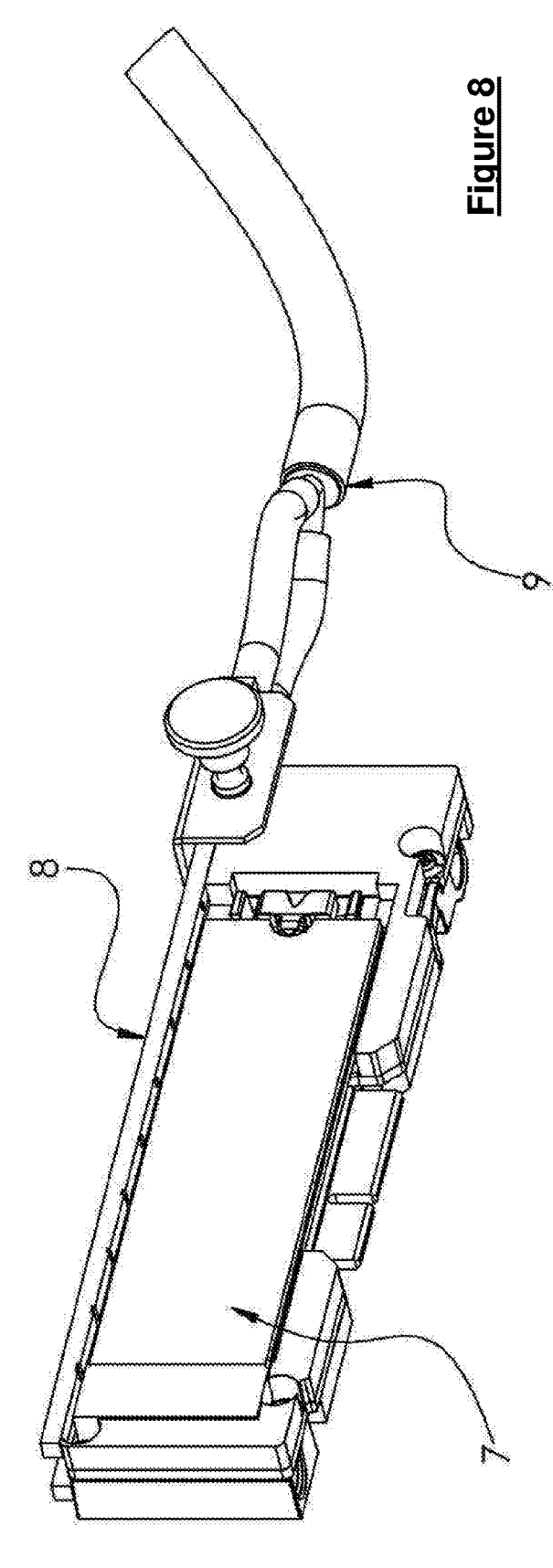
FIG. 8 depicts a perspective view of a cooling arrangement according to a second embodiment.

As described previously, vertically-mounted components are traditionally cooled with front-to-rear (or rear-to-front) fan-forced air. The fins of heatsinks that can be placed on top of board components are traditionally above the tideline of any coolant in the container and therefore have a limited capability for dissipating heat in the absence of forced air flow. Thus, it will be appreciated the provision of the second and third cooling elements 32*a* and 32*b* sat above the second and third sets of vertically-mounted electronic components 31*a* and 31*b* allows heat to be drawn from those sets of vertically-mounted components 31*a* and 31*b* to improve the efficiency of cooling. Hence, embodiments of the present disclosure provide efficient means for cooling DIMMs (as shown in FIG. 5), M.2s (as shown in FIG. 8) and server motherboard heatsinks. Such components are not typically able to be cooled by bath heat sinks (e.g. the heat sink 1 of FIGS. 1 to 4) or by cold plates and are difficult seal around at the board surface, due to the presence of small components such as miniature capacitors on the server motherboard adjacent to these components. Therefore, cooling of these components is improved significantly through the use of embodiments of the present disclosure. Moreover, DIMMs and M.2s frequently require servicing, replacing or upgrading and are also likely to be added over time. Therefore, the quick and easy access to these components that is facilitated by embodiments of the present disclosure is highly advantageous, and the present disclosure helps to overcome a number of problems within sealed immersion chassis.

Turning next to FIG. 8, there is shown a cooling arrangement according to a second embodiment. This cooling arrangement can be provided within the container 100 of FIGS. 1 to 4. The cooling arrangement can be used in addition to, or instead of, the heat sink arrangements of FIGS. 5 to 7. For instance, the second and/or third cooling elements 32*a* and 32*b* of FIGS. 5 to 7 can be substituted with a cooling tube 38, which may be a perforated sealed-end tube that permits coolant to pass (e.g. dribble) through openings (e.g. slits) in its underside, thereby distributing coolant over vertically-mounted electronic components positioned below the cooling tube 38. As shown in FIG. 8, a cooling tube 38 can be mounted above just a single (or double) vertically-oriented cards, such as an M.2 arrangement 37. Additional or alternatively, such a cooling tube 38 can also be mounted above backplanes or riser cards. In FIG. 8, the cooling tube 38 is fed liquid coolant by a compliant tube system 39.

The embodiment of FIG. 8 operates according to similar principles to FIGS. 5 to 7, in that it can be used to cool electronic components mounted below the cooling tube. In generalised terms, therefore, the embodiment of FIG. 8 may be considered to be: a cooling tube for cooling a set of electronic components, configured to distribute liquid coolant over the set of electronic components. The cooling tube may comprise openings, apertures and/or slits of any kind to achieve a desired flow rate. There may be provided a cooling module comprising a container configured to retain the set of electronic components within the container; and a cooling tube configured to cool the set of electronic components. Thus, effective cooling of the components can be achieved by means of the cooling tube. The cooling module may comprise the set of electronic components or may simply be configured to contain the set of electronic components. The cooling tube may be fed liquid coolant overflowing from another heat sink (e.g. in the same way as the second and third cooling elements 32a and 32b received liquid coolant overflowing from the first cooling element 35).

Continuing to use the generalised terms used previously, the present disclosure provides a cooling module (e.g. the cooling module 100 shown in FIGS. 1 and 2) for cooling first and second sets of electronic components (which can be any two sets of electronic components described above), comprising: a container configured to retain the first and second sets of electronic components within the container; and any of the heat sink arrangements (e.g. any of the arrangements comprising cooling elements 32a, 32b, 35 and 38) described previously, arranged to cool the first and second sets of electronic components. The container may be configured to retain the first and second sets of electronic components in that the sets of electronic components can be mounted thereon, or the container may be configured for attachment to the sets of electronic components. Additionally or alternatively, it may be the base comprises an attachment mechanism for engaging the sets of components (e.g. physical connections for those sets of components).

In the cooling modules of the present disclosure, the first cooling element may be mounted on the first set of electronic components and the second cooling element may be positioned above the second set of electronic components. This may be achieved by the way in which the first and second cooling elements are secured to one another. In this way, the second cooling elements may be provided in proximity to a second set of electronic components that would otherwise be difficult to cool.

The cooling modules of the present disclosure may further comprise a nozzle arrangement comprising one or more nozzles, arranged to receive liquid coolant and direct the liquid coolant into the volume of the first cooling element. The cooling module may further comprise one or more pumps configured to cause the liquid coolant to flow within the container. The cooling module may further comprise at least one pipe (e.g. pipe 36), arranged to transport liquid coolant from the one or more pumps to the nozzle arrangement. Preferably, each of the one or more nozzles are configured to push fit couple to a respective end of the at least one pipe. In the cooling modules of the present disclosure, the liquid coolant may be a primary liquid coolant, the cooling module further comprising a heat exchanger, configured to receive a secondary liquid coolant and to transfer heat from the primary liquid coolant to the secondary liquid coolant. Thus, efficient cooling can be achieved.

The second set of electronic components may comprise one or more vertically-mounted electronic components (e.g. DIMMs or M.2). In such a case, it is preferred that the second cooling element comprises one or more openings for distributing liquid coolant over a respective one or more electronic components of the second set of electronic components, and the one or more openings are aligned with (i.e. directly above such that coolant falls from the opening onto the components below) the one or more vertically-mounted electronic components (or if the vertically-mounted electronic components are omitted from the cooling module, then the openings may instead be aligned with one or more attachment mechanisms in the cooling module that are suitable for retaining the one or more vertically-mounted electronic components). Thus, efficient distribution of coolant to the vertically-mounted electronic components, and hence efficient cooling of the vertically-mounted electronic components, may be achieved.

Throughout the present disclosure, the first set of electronic components may comprise one or more central processing units, CPUs and/or one or more graphics processing unit, GPUs. The first set of electronic components may comprise a cluster of CPUs and/or CPUs. Additionally or alternatively, the second set of electronic components may comprise one or more memory modules and/or one or more dual in-line memory modules and/or one or more expansion cards and/or one or more printed circuit boards. The second set of electronic components can comprise any auxiliary heat emitting component. Various other components can be cooled advantageously using the present disclosure.

A common feature in the above embodiments is that the rate of flow of liquid coolant to the components to be cooled can be determined by computational analysis. The flow rate can be controlled by various methods, which might include increased/decreased pump speed, different internal diameter tubes, taller walls around the trays of the cooling elements to increase the head, or different sized and/or shaped slits and/or openings. It will be appreciated that the skilled reader will be capable of customising the flow rate using these parameters to achieve effective cooling for a wide variety of components, and so the advantageous embodiments described above are not limited to DIMM or M.2. Indeed, any components can be cooled using the present disclosure, although vertically-mounted components or elongate components are most preferred. It will also be appreciated that the cooling modules of the present disclosure may comprise, be connected to and/or be connectable to a controller configured to control the flow rate of coolant within the container (e.g. by changing a flow rate of liquid coolant). This allows the rate of cooling to be optimised.

Moreover, upon reading the embodiments described above, it will be appreciated by the skilled reader that the liquid coolant should be kept in liquid form. In other words, there should be no phase change of the liquid coolant, as evaporation of liquid coolant may reduce the efficacy of the above-described embodiments.

It will be understood that many variations may be made to the above apparatus, systems and methods whilst retaining the advantages noted previously. For example, where specific types flexible materials have been described, alternative materials can be provided that provide the same or similar functionality.

Moreover, various types of pumping and liquid transfer arrangements can be employed. The depicted arrangements are for illustrative purposes only and any alternative arrangement can be used, including any of the arrangements described and illustrated in WO-2019/048864 (WO'864). Similarly, while DIMM and M.2 have been referred to extensively above, other electronic components can be cooled using features of the present disclosure.

Each feature disclosed in this specification, unless stated otherwise, may be replaced by alternative features serving the same, equivalent or similar purpose. Thus, unless stated otherwise, each feature disclosed is one example only of a generic series of equivalent or similar features.

As used herein, including in the claims, unless the context indicates otherwise, singular forms of the terms herein are to be construed as including the plural form and, where the context allows, vice versa. For instance, unless the context indicates otherwise, a singular reference herein including in the claims, such as "a" or "an" (such as an electronic component or a cooling element) means "one or more" (for instance, one or more electronic components, or one or more cooling element). Throughout the description and claims of this disclosure, the words "comprise", "including", "having" and "contain" and variations of the words, for example "comprising" and "comprises" or similar, mean "including but not limited to", and are not intended to (and do not) exclude other components.

The use of any and all examples, or exemplary language ("for instance", "such as", "for example" and like language) provided herein, is intended merely to better illustrate the disclosure and does not indicate a limitation on the scope of the disclosure unless otherwise claimed. No language in the specification should be construed as indicating any non-claimed element as essential to the practice of the disclosure.

Any steps described in this specification may be performed in any order or simultaneously unless stated or the context requires otherwise. Moreover, where a step is described as being performed after a step, this does not preclude intervening steps being performed.

All of the aspects and/or features disclosed in this specification may be combined in any combination, except combinations where at least some of such features and/or steps are mutually exclusive. In particular, the preferred features of the disclosure are applicable to all aspects and embodiments of the disclosure and may be used in any combination. Likewise, features described in non-essential combinations may be used separately (not in combination).

A method of manufacturing and/or operating any of the devices (or arrangements of devices) disclosed herein is also provided. The method may comprise steps of providing each of features disclosed and/or configuring the respective feature for its stated function.

The invention claimed is:

1. A heat sink arrangement for cooling first and second sets of electronic components positioned below the heat sink arrangement, comprising:

a first cooling element for cooling the first set of electronic components, wherein the first cooling element is a first heat sink comprising a base and a retaining wall that together define a volume for holding liquid coolant;

a second cooling element for cooling the second set of electronic components, the second cooling element comprising:

a base comprising one or more openings for distributing liquid coolant over a respective one or more electronic components of the second set of electronic components;

wherein the first and second cooling elements are arranged such that liquid coolant overflows from the volume of the first cooling element to the second cooling element for distribution over the second set of electronic components.

2. The heat sink arrangement of claim 1, wherein the second cooling element extends along an edge of the first cooling element.

3. The heat sink arrangement of claim 1, wherein a depth of the first cooling element is greater than a depth of the second cooling element.

4. The heat sink arrangement of claim 1, wherein the first cooling element is configured for mounting on top of a heat-transmitting region of the first set of electronic components, preferably wherein the base of the first cooling element is configured for mounting on top of a heat-transmitting region of the first set of electronic components.

5. The heat sink arrangement of claim 1, wherein the first and second cooling elements are secured to each other, preferably wherein the second cooling element is secured to an upper edge of the retaining wall of the first cooling element.

6. The heat sink arrangement of claim 1, wherein the second cooling element is secured to a support frame that spans and/or at least partially surrounds the volume of the first cooling element.

7. The heat sink arrangement of claim 1, wherein the second cooling element is releasably and/or pivotably secured to permit access to the second set of electronic components.

8. The heat sink arrangement of claim 1, wherein the second cooling element is movable and/or elastically deformable to permit access to the second set of electronic components.

9. The heat sink arrangement of claim 1, wherein the one or more openings are elevated with respect to the base of the second cooling element, preferably wherein the one or more openings are at substantially the same height above the base of the second cooling element.

10. The heat sink arrangement of claim 1, wherein the base of the second cooling element comprises a structure for dispersing liquid coolant across the base of the second cooling element, preferably wherein the structure comprises:

one or more channels;

one or more ridges;

one or more baffles; and/or one or more protrusions.

11. The heat sink arrangement of claim 10, wherein the structure comprises a plurality of longitudinal and latitudinal channel portions that extend across the base of the second cooling element.

12. The heat sink arrangement of claim 1, further comprising a third cooling element for cooling a third set of electronic components, configured to distribute liquid coolant over the third set of electronic components.

13. The heat sink arrangement of claim 12, wherein the second and third cooling elements are disposed on opposite sides of the first cooling element.

14. The heat sink arrangement of claim 12, wherein the second and third cooling elements are substantially symmetric about a plane passing through the first cooling element.

15. A cooling module for cooling first and second sets of electronic components, comprising:

a container configured to retain the first and second sets of electronic components within the container; and a heat sink arrangement for cooling the first and second sets of electronic components positioned below the heat sink arrangement, the heat sink arrangement comprising:

a first cooling element for cooling the first set of electronic components, wherein the first cooling element is a first heat sink comprising a base and a retaining wall that together define a volume for holding liquid coolant;

a second cooling element for cooling the second set of electronic components, the second cooling element comprising:

a base comprising one or more openings for distributing liquid coolant over a respective one or more electronic components of the second set of electronic components;

wherein the first and second cooling elements are arranged such that liquid coolant overflows from the volume of the first cooling element to the second cooling element for distribution over the second set of electronic components.

16. The cooling module of claim 15, wherein the first cooling element is mounted on the first set of electronic components and the second cooling element is positioned above the second set of electronic components.

17. The cooling module of claim 15, further comprising one or more pumps configured to cause the liquid coolant to flow within the container.

18. The cooling module of claim 15, wherein the liquid coolant is a primary liquid coolant, the cooling module further comprising a heat exchanger, configured to receive a secondary liquid coolant and to transfer heat from the primary liquid coolant to the secondary liquid coolant.

19. The cooling module of claim 15, wherein the second set of electronic components comprises one or more vertically-mounted electronic components, preferably wherein the one or more openings are aligned with the one or more vertically-mounted electronic components.

* * * * *